US012763285B2

(12) United States Patent
Sun et al.

(10) Patent No.: US 12,763,285 B2
(45) Date of Patent: Oct. 13, 2026

(54) NANOSCALE FAILURE ANALYSIS METHOD

(71) Applicant: Shanghai Huali Microelectronics Corporation, Shanghai (CN)

(72) Inventors: Yunong Sun, Shanghai (CN); Cheng Wu, Shanghai (CN); Shuqing Duan, Shanghai (CN); Jinde Gao, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 301 days.

(21) Appl. No.: 18/643,363

(22) Filed: Apr. 23, 2024

(65) Prior Publication Data

US 2025/0087453 A1 Mar. 13, 2025

(30) Foreign Application Priority Data

Sep. 11, 2023 (CN) ......................... 202311167439.9

(51) Int. Cl.

| | |
|---|---|
| ***H01J 37/31*** | (2006.01) |
| ***H01J 37/08*** | (2006.01) |
| ***H01J 37/26*** | (2006.01) |
| ***H01J 37/305*** | (2006.01) |
| ***H01J 37/317*** | (2006.01) |

(52) U.S. Cl.
CPC ............ *H01J 37/305* (2013.01); *H01J 37/08* (2013.01); *H01J 37/26* (2013.01); *H01J 37/317* (2013.01); *H01J 2237/31745* (2013.01); *H01J 2237/31749* (2013.01)

(58) Field of Classification Search
CPC .......... H01J 37/305; H01J 37/08; H01J 37/26; H01J 37/317; H01J 2237/31745; H01J 2237/31749
See application file for complete search history.

(56) References Cited

U.S. PATENT DOCUMENTS 5,392,222 A * 2/1995 Noble ..................... G06F 30/39 716/52
5,976,980 A * 11/1999 Livengood ............ B24B 37/013 257/E23.179
7,960,695 B1 * 6/2011 Kley ...................... G01Q 60/38 250/306
2006/0228897 A1 * 10/2006 Timans ............... H10P 72/0436 438/758

* cited by examiner

*Primary Examiner* — Nicole M Ippolito
(74) *Attorney, Agent, or Firm* — Banner & Witcoff, Ltd.

(57) ABSTRACT

This application discloses a nanoscale failure analysis method, including step 1: placing a first sample to be analyzed on a sample stage of an FIB machine, and performing cutting on a selected area of the first sample by using an ion beam in the FIB machine to form a first cross section and expose a metal pattern on the first cross section; step 2: depositing a protective layer on the first cross section by using an electron beam of the FIB machine; step 3: transferring the first sample to a nano prober, the protective layer being used for protecting the metal pattern and preventing metal diffusion in a transfer process; step 4: performing surface micro treatment on the first sample by using an ion source in the nano prober to remove the protective layer; step 5: performing probing on the metal pattern and implementing electrical testing through the nano prober.

17 Claims, 7 Drawing Sheets

NANOSCALE FAILURE ANALYSIS METHOD

CROSS-REFERENCE TO RELATED APPLICATIONS

This application claims the priority to Chinese patent application No. 202311167439.9, filed on Sep. 11, 2023, the disclosure of which is incorporated herein by reference in its entirety.

TECHNICAL FIELD

This application relates to a semiconductor integrated circuit manufacturing method, in particular to a nanoscale failure analysis method.

BACKGROUND

Nano prober is a nano probe system that integrates a Scanning Electron Microscope (SEM). It can perform nanoscale failure analysis on devices in integrated circuit chips, such as electrical characteristic parameter measurement, nanoscale open and short failure locating, and can also perform micro treatment on the surfaces of samples, such as removing residual oxide layers from the surfaces of the samples. At present, test samples can be divided into plane samples and cross-section samples. For most conventional samples, electrical testing can be completed through plane probing; for some special samples with uneven metal patterns or long target areas, cross-section-probing testing is more suitable due to the formation of certain height differences during polishing.

For example, in a flash memory such as Nor Flash, there may be a bit line (BL) short fail case where the addresses of two short-circuited BLs are known. That is, the addresses of the two short-circuited BLs can be determined by testing the chip. However, due to the length of the BL being as long as several hundred micrometers, it is necessary to find the defect that causes the bridging of the two BLs within the target area with length of several hundred micrometers, and it is not known which layer the defect is on.

In response to the BL short fail case mentioned above, the existing nanoscale failure analysis method firstly uses a Focused Ion Beam (FIB) to dig a hole in a cross section at one end of the target area of the sample to expose the metal pattern, then continuously confirms the electrical properties and reduces the range through nano probe testing and a bisection method, then reduces the length of the area to several micrometers, and finally accurately locates the defect through SEM high-voltage observation or TEM physical property analysis.

The existing nanoscale failure analysis method has the following problems:

1. The metal, including copper, of the Nor Flash product is extremely easy to diffuse. In the process of transferring the sample from the FIB machine to the nano prober, the metal in the cross section of the sample has already severely diffused, as illustrated in FIG. 1A and FIG. 1B. FIG. 1A illustrates an SEM image of a cross section of a sample after cutting in an FIB machine in the existing nanoscale failure analysis method. It can be seen that a target area 101 is located on the cross section after cutting. The metal pattern on the cross section in FIG. 1A is a bit line 102. The bit line 102 illustrated in FIG. 1A is only the side surface of the bit line 102. In FIG. 1A, a top surface 102*a* of the bit line 102 is also illustrated at an upper part of the cross section. FIG. 1B illustrates an SEM image of a cross section after transferring a sample to a nano prober in the existing nanoscale failure analysis method. A defect 103 is a short-circuit defect formed by Cu diffusion. A bottom area 104 in FIG. 1B is an enlarged view of an area near the defect 103 in FIG. 1B 2. Metal diffusion will cause all metals to bridge together, making it impossible to confirm the electrical characteristics of fail twin bit lines (fail twin BLs) and reference twin bit lines (ref twin BLs).

3. It is not possible to further reduce the failure range through the bisection method.

4. It can only rely solely on SEM high voltage to search for the defect, which is time-consuming, labor-intensive, and difficult to detect.

5. The target area is long, and it is difficult to ensure the flatness of the sample because of no pertinent manual polishing.

BRIEF SUMMARY

According to some embodiments in this application, a nanoscale failure analysis method is disclosed in the following steps:

step 1: providing a first sample to be analyzed, placing the first sample on a sample stage of an FIB machine, and performing cutting on a selected area of the first sample by using an ion beam in the FIB machine to form a first cross section and expose a metal pattern on the first cross section;

step 2: depositing a protective layer on the first cross section by using an electron beam of the FIB machine;

step 3: transferring the first sample to a nano prober, the protective layer being used for protecting the metal pattern and preventing metal diffusion in a transfer process;

step 4: performing surface micro treatment on the first sample by using an ion source in the nano prober to remove the protective layer and expose the metal pattern;

step 5: performing probing on the metal pattern and implementing electrical testing through the nano prober.

In some cases, in step 1, after the first sample is placed on the sample stage, the sample stage is placed at the height of a common focal point of the ion beam and the electron beam.

In some cases, in step 1, after the sample stage is placed at the height of the common focal point of the ion beam and the electron beam, and before the cutting is performed, the nanoscale failure analysis method further includes setting the angle of the sample stage to a first angle, the first angle being between −38° and 52°.

In some cases, in step 2, before the protective layer is deposited, the nanoscale failure analysis method further includes setting the angle of the sample stage to a second angle.

In some cases, the second angle is an angle obtained by anticlockwise rotating for 38° based on the first angle, so that the direction of the electron beam is perpendicular to the first cross section.

In some cases, in step 2, the material of the protective layer includes silicon dioxide.

In some cases, in step 2, the thickness of the protective layer is 0.03 μm-0.07 μm.

In some cases, in step 3, after the first sample is transferred to the nano prober, the nanoscale failure analysis method further includes performing metal diffusion testing to verify that the metal diffusion has not occurred; in a case that the metal diffusion testing finds that the metal diffusion has occurred, increasing the thickness of the protective layer in step 2 at a next time.

In some cases, step 1 to step 5 form a group of cyclic steps, and in the nanoscale failure analysis method, a plurality of groups of cyclic steps are performed until a fail position is found in the first sample.

In some cases, in step 1, the selected area of the first sample is set according to a target area, and the target area is the smallest analysis area containing the fail position confirmed before step 1; the first cross section is greater than or equal to a projection area of the target area on the first cross section, so that the metal pattern in the target area is all exposed on the first cross section; in step 2, the coverage area of the protective layer is greater than or equal to the projection area of the target area on the first cross section;

in step 1 of each group of cyclic steps, the target area is gradually reduced.

In some cases, the target area is gradually reduced by adopting a bisection method.

In some cases, in step 4, the ion source is Ar plasmas, and the surface micro treatment is implemented by bombarding the first sample with the Ar plasmas.

In some cases, in step 4, the morphology of the metal pattern on the first cross section is observed at 0.5 kV to determine the stopping time of the surface micro treatment, and the time of the surface micro treatment is 10-20 min.

In some cases, in step 1, the first sample is obtained through polishing, and the first sample is polished to a metal layer where the metal pattern is located.

In some cases, the metal pattern includes a bit line, and the length of the first sample along the length direction of the bit line is greater than or equal to the length of the bit line; the width of the first sample along the width direction of the bit line is greater than the width of a plurality of bit lines, the plurality of bit lines at least include fail twin bit lines and reference twin bit lines, the pair of fail bit lines are short-circuited, and the pair of reference bit lines are not conducted;

in step 1, a top side of the first cross section is along the width direction of the bit line;

the width of the top side of the first cross section formed in each group of cyclic steps is the same and aligned along the length direction of the bit line;

the width of the target area in each group of cyclic steps is less than or equal to the width of the top side of the first cross section;

the length direction of the target area in each group of cyclic steps is along the length direction of the bit line, and the length of the target area in each group of cyclic steps is gradually decreased.

In some cases, the target area in the last group of cyclic steps is a final target area, the length and width of the final target area are within the range of TEM observation, and the fail position is located in the final target area;

after the last group of cyclic steps are completed, the nanoscale failure analysis method further includes performing TEM plane observation and TEM cross section observation on the final target area to determine a defect structure of the fail position.

In some cases, the target area in the first group of cyclic steps is an initial target area, and the length of the initial target area is several hundred micrometers;

the length of the final target area is several micrometers.

In this application, the first sample is not directly transferred to the nano prober after the first sample is cut by adopting the ion beam in the FIB machine and the first cross section is formed, but a protective layer is deposited on the first cross section by adopting the electron beam in the FIB machine. Under the protection of the protective layer, metal diffusion can be prevented in the process of transferring the first sample to the nano prober. After transferring to the nano prober, the protective layer is removed by adopting an ion source by using the characteristic that the nano prober is provided with the ion source. Then, electrical testing is performed. Since no metal diffusion occurs, the fail position can be analyzed through electrical testing. Therefore, this application can perform cross-section-probing testing on the sample by adopting the nano prober, can also prevent the diffusion of the metal exposed on the cross section in the process of transferring the sample to the nano prober, can implement fail position analysis through the electrical testing by the nano prober, and can continuously reduce the range of the target area containing the fail position, thus quickly finding the fail position, reducing the failure analysis time and workload, reducing the difficulty in finding the fail position and fail structure, and improving the accuracy of failure analysis.

BRIEF DESCRIPTION OF THE DRAWINGS

This application will be further described below in detail in combination with the specific embodiments with reference to the drawings.

DETAILED DESCRIPTION OF THIS APPLICATION

Figure 2:
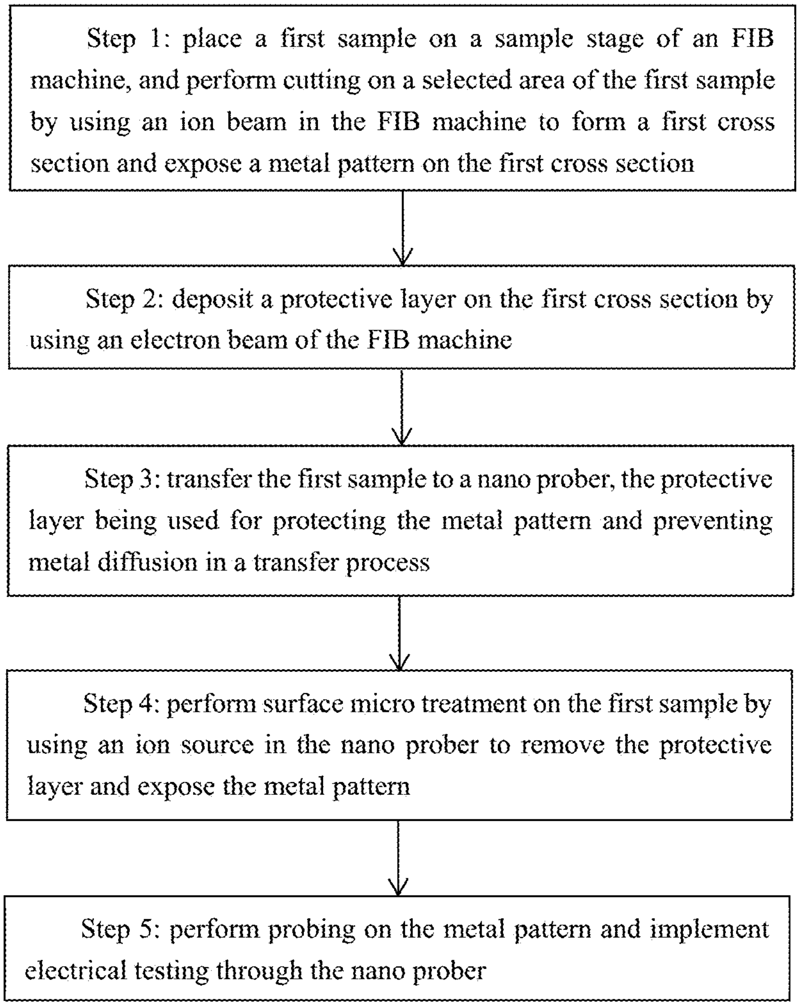
FIG. 2 illustrates a flowchart of a nanoscale failure analysis method according to an embodiment of this application.
Figure 3A:
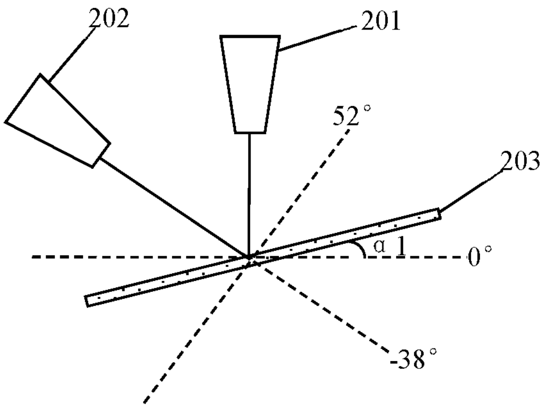
FIG. 3A illustrates a schematic diagram of adjusting the angle of a sample stage in step 1 of a nanoscale failure analysis method according to an embodiment of this application.
Figure 3B:
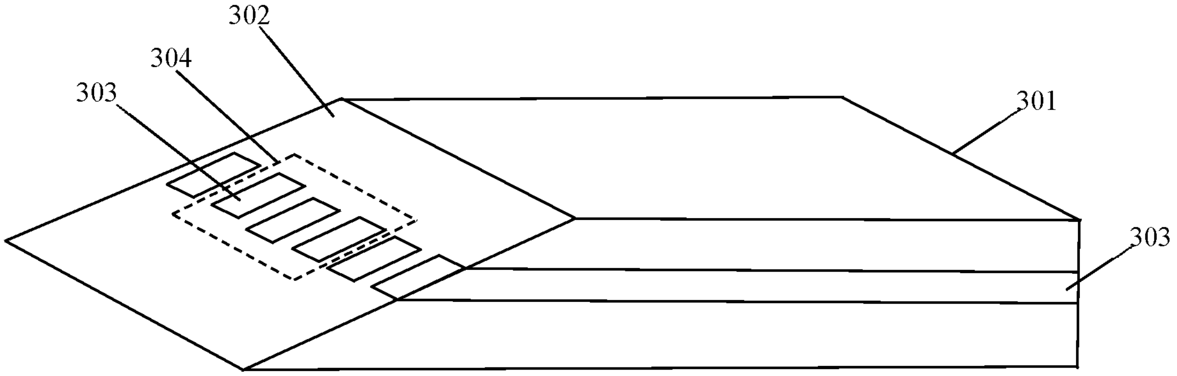
FIG. 3B illustrates a structural schematic diagram of a first sample after forming a first cross section in step 1 of a nanoscale failure analysis method according to an embodiment of this application.

Referring to FIG. 2, it illustrates a flowchart of a nanoscale failure analysis method according to an embodiment of this application. The nanoscale failure analysis method according to this embodiment of this application includes the following steps:

In step 1, referring to FIG. 3B, a first sample 301 to be analyzed is provided; referring to FIG. 3A, the first sample 301 is placed on a sample stage 203 of an FIB machine, and cutting is performed on a selected area of the first sample 301 by using an ion beam provided by an ion beam gun 202 in the FIB machine to form a first cross section 302 and expose a metal pattern 303 on the first cross section 302.

In this embodiment of this application, after the first sample 301 is placed on the sample stage 203, the sample stage 203 is placed at the height of a common focal point of the ion beam and the electron beam.

After the sample stage 203 is placed at the height of the common focal point of the ion beam and the electron beam, and before the cutting is performed, the nanoscale failure analysis method further includes setting the angle of the sample stage 203 to a first angle α1, and the first angle α1 is between −38° and 52°. Three dashed lines correspond to 0°, −38°, and 52°, respectively. The 0° dashed line represents the horizontal line. The first angle is an angle relative to the horizontal dashed line.

Figure 4A:
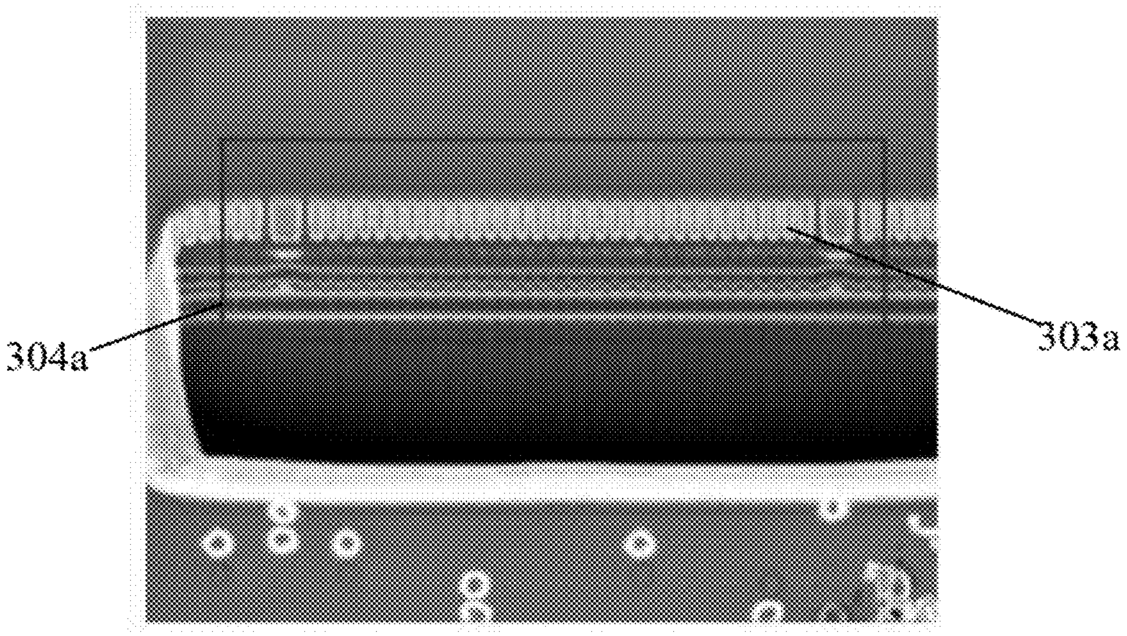
FIG. 4A illustrates an SEM image of a first cross section formed after cutting in step 1 of a nanoscale failure analysis method according to an embodiment of this application.

In this embodiment of this application, the selected area of the first sample 301 is set according to a target area, and the target area is the smallest analysis area containing the fail position confirmed before step 1. The first cross section 302 is greater than or equal to a projection area 304 of the target area on the first cross section 302, so that the metal pattern 303 in the target area is all exposed on the first cross section 302. Referring to FIG. 4A, it illustrates an SEM image of a first cross section formed after cutting in step 1 of a nanoscale failure analysis method according to an embodiment of this application. In FIG. 4A, box 304*a* is the target area observed from the first cross section 302, i.e., a protection area of the target area on the first cross section. In FIG. 4A, the metal pattern is marked separately by 303*a*.

In this embodiment of this application, the first sample 301 is obtained through polishing, and the first sample 301 is polished to a metal layer where the metal pattern 303 is located.

In some embodiments, the metal pattern 303 includes a bit line, and the length of the first sample 301 along the length direction of the bit line is greater than or equal to the length of the bit line; the width of the first sample 301 along the width direction of the bit line is greater than the width of a plurality of bit lines, the plurality of bit lines at least include fail twin bit lines and reference twin bit lines, the fail twin bit lines are short-circuited, and the reference twin bit lines are not conducted. Referring to FIG. 4A, it illustrates a plurality of metal patterns 303*a*, where only two adjacent metal patterns 303*a* are fail twin bit lines (fail twin BLs), and the number of other metal patterns 303*a* is more than two, two of which are selected as reference twin bit lines (ref twin BLs).

A top side of the first cross section 302 is along the width direction of the bit line. In FIG. 4A, the width direction of the bit line can only be observed.

Figure 6A:
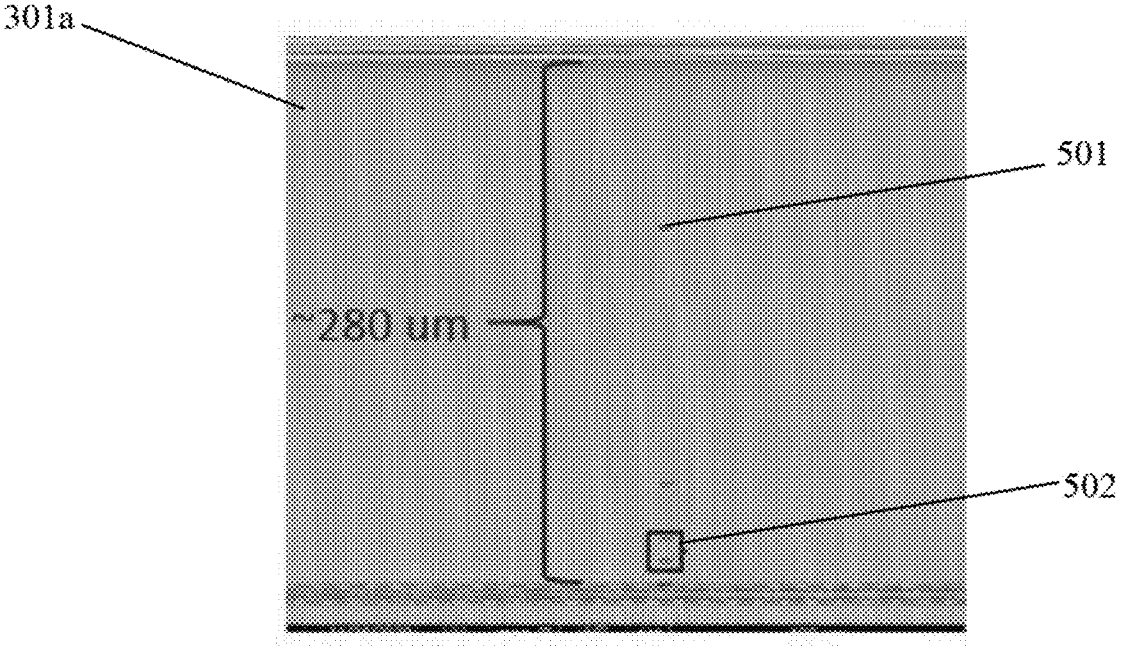
FIG. 6A illustrates a top view image of a first sample including an entire initial target area in a nanoscale failure analysis method according to an embodiment of this application.

Referring to FIG. 6A, it illustrates a top view image of a first sample including an entire initial target area in a nanoscale failure analysis method according to an embodiment of this application. In FIG. 6A, the first sample is represented separately by reference sign 301*a*, a trench 501 is a trench formed after cutting in step 1, and one side surface of the trench 501 is the first cross section 302. In addition, referring to FIG. 6B, an enlarged view of the trench 501 can be observed in FIG. 6B, and the first cross section of the trench 501 is marked separately by reference sign 302*a*.

In step 2, a protective layer is deposited on the first cross section 302 by using an electron beam of the FIB machine. In FIG. 3E, the forming area of the protective layer is an area represented by dashed box 305.

Figure 3C:
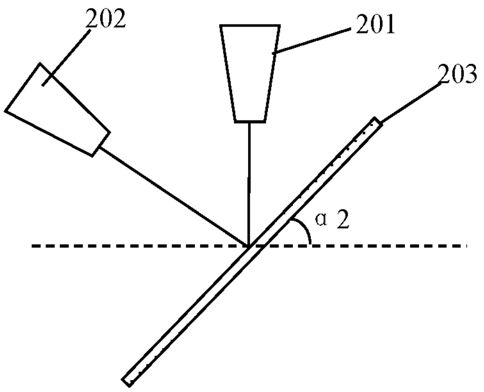
FIG. 3C illustrates a schematic diagram of adjusting the angle of a sample stage in step 2 of a nanoscale failure analysis method according to an embodiment of this application.

In this embodiment of this application, referring to FIG. 3C, before the protective layer is deposited, the nanoscale failure analysis method further includes setting the angle of the sample stage 203 to a second angle α2.

Figure 3D:
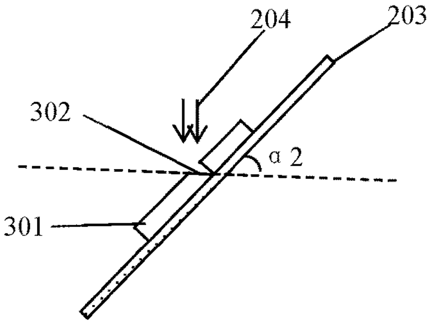
FIG. 3D illustrates a schematic diagram that the direction of an electron beam is perpendicular to a first cross section in step 2 of a nanoscale failure analysis method according to an embodiment of this application.
Figure 3E:
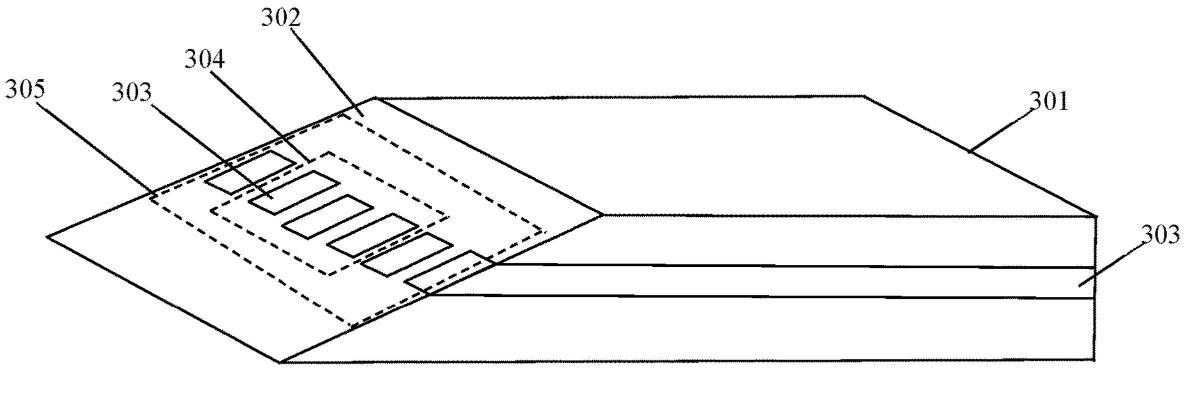
FIG. 3E illustrates a structural schematic diagram after forming a protective layer in step 2 of a nanoscale failure analysis method according to an embodiment of this application.

Referring to FIG. 3D, the second angle α2 is an angle obtained by anticlockwise rotating for 38° based on the first angle α1, so that the direction of the electron beam is perpendicular to the first cross section 302. In FIG. 3D, arrow line 204 represents the electron beam, and the direction of the arrow line 204 is the direction of the electron beam. It can be seen that the arrow line 204 is vertically downwards, and the first cross section 302 is at a horizontal position, so the two are perpendicular.

The material of the protective layer includes silicon dioxide. In some embodiments, the thickness of the protective layer is 0.03 μm-0.07 μm.

Figure 4B:
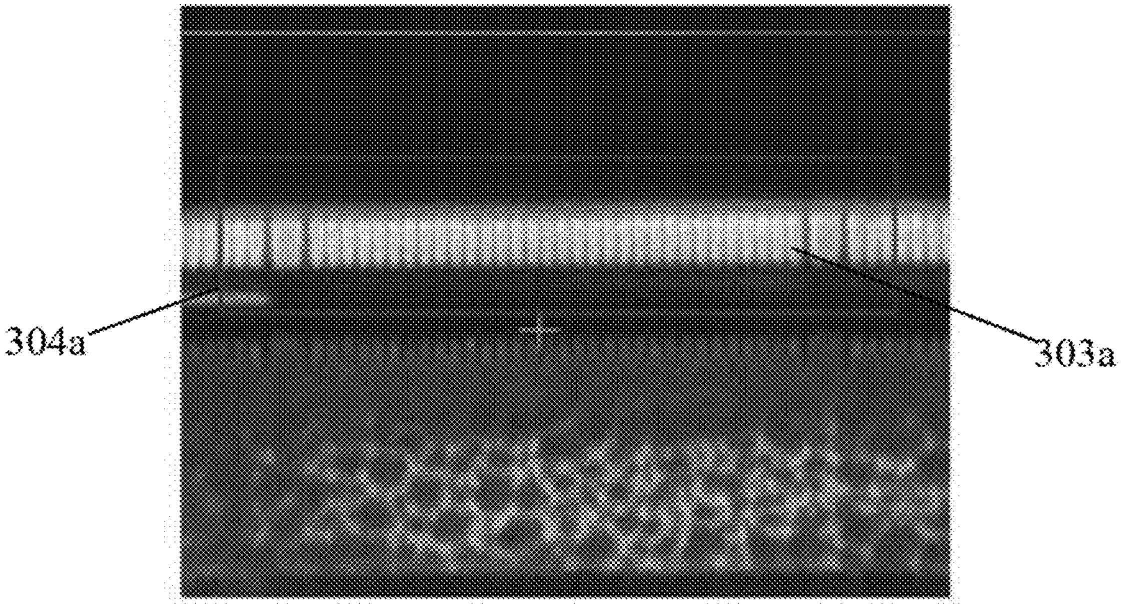
FIG. 4B illustrates an SEM image of a first cross section formed with a protective layer on a surface in step 2 of a nanoscale failure analysis method according to an embodiment of this application.

In this embodiment of this application, the coverage area of the protective layer is greater than or equal to the projection area 304 of the target area on the first cross section 302. Referring to FIG. 4B, it illustrates an SEM image of a first cross section formed with a protective layer on a surface in step 2 of a nanoscale failure analysis method according to an embodiment of this application. Compared with FIG. 4A, the metal pattern 303*a* is covered with the protective layer.

In step 3, the first sample 301 is transferred to a nano prober. The protective layer is used for protecting the metal pattern 303 and preventing metal diffusion in a transfer process.

In this embodiment of this application, after the first sample 301 is transferred to the nano prober, the nanoscale failure analysis method further includes performing metal diffusion testing to verify that the metal diffusion has not occurred; in a case that the metal diffusion testing finds that the metal diffusion has occurred, increasing the thickness of the protective layer in step 2 at a next time. In some embodiments, the metal diffusion testing only needs to be performed in the process of selecting the thickness of the protective layer. After the thickness of the protective layer is selected, it represents that the protective layer can achieve the protection of the metal pattern 303, so it is not necessary to perform further metal diffusion testing in the future.

Figure 5:
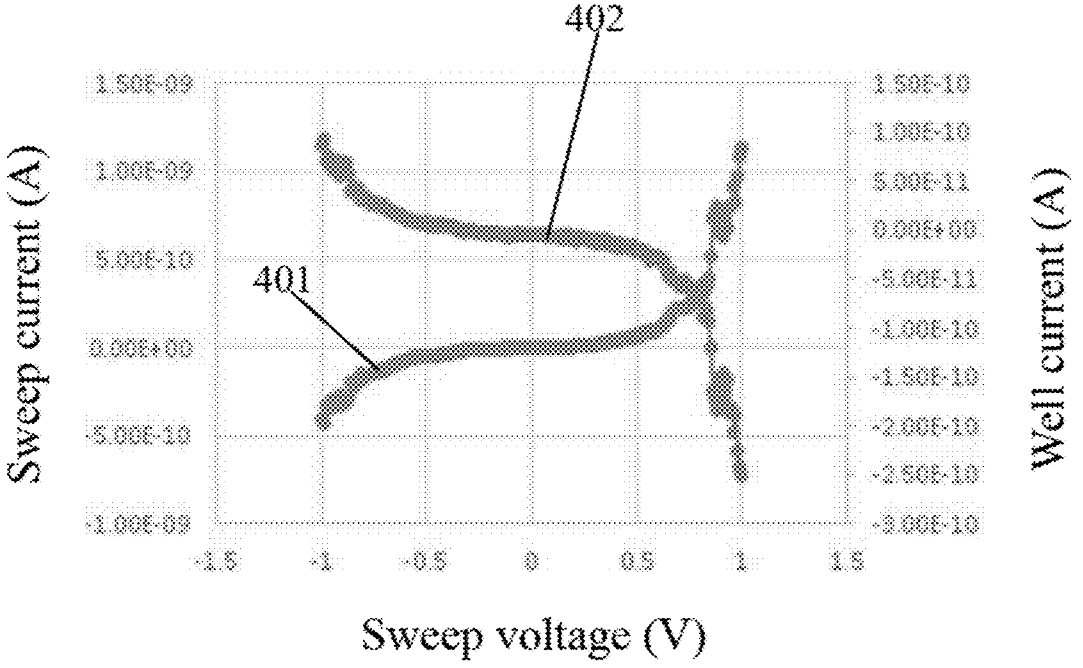
FIG. 5 illustrates a leakage curve obtained by performing metal diffusion testing in step 3 of a nanoscale failure analysis method according to an embodiment of this application.

In this embodiment of this application, the metal diffusion testing is implemented by performing leakage testing on the reference twin bit lines. In a case that the leakage in the leakage testing is large, it indicates that there is metal diffusion. In a case that there is no leakage, it indicates that no metal diffusion has occurred. Referring to FIG. 5, it illustrates a leakage curve obtained by performing metal diffusion testing in step 3 of a nanoscale failure analysis method according to an embodiment of this application. In FIG. 5, the horizontal axis represents the sweep voltage, the left vertical axis represents the sweep current, and the right vertical axis represents the well current. In FIG. 5, curve 401 represents the sweep curve between the reference twin bit lines, from which it can be seen that, within ±0.5V, the sweep current is 0 A. FIG. 5 also illustrates the curve 402 of the well current.

In step 4, surface micro treatment is performed on the first sample 301 by using an ion source in the nano prober to remove the protective layer and expose the metal pattern 303.

In this embodiment of this application, the ion source is Ar plasmas, and the surface micro treatment is implemented by bombarding the first sample 301 with the Ar plasmas.

The morphology of the metal pattern 303 on the first cross section 302 is observed at 0.5 kV to determine the stopping time of the surface micro treatment, and the time of the surface micro treatment is 10-20 min.

Figure 1A:
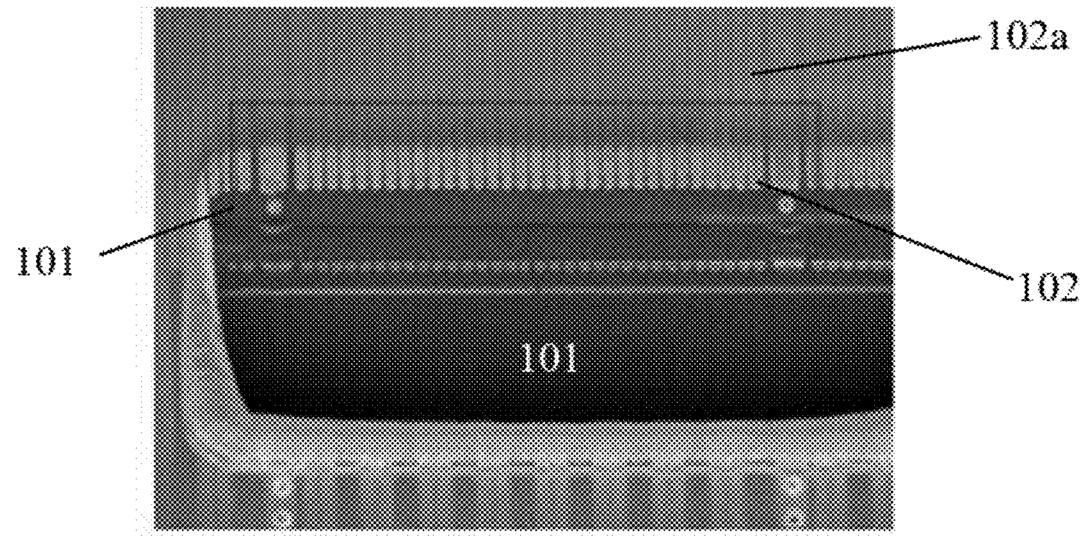
FIG. 1A (Prior Art)
FIG. 1A illustrates an SEM image of a cross section of a sample after cutting in an FIB machine in an existing nanoscale failure analysis method.
Figure 1B:
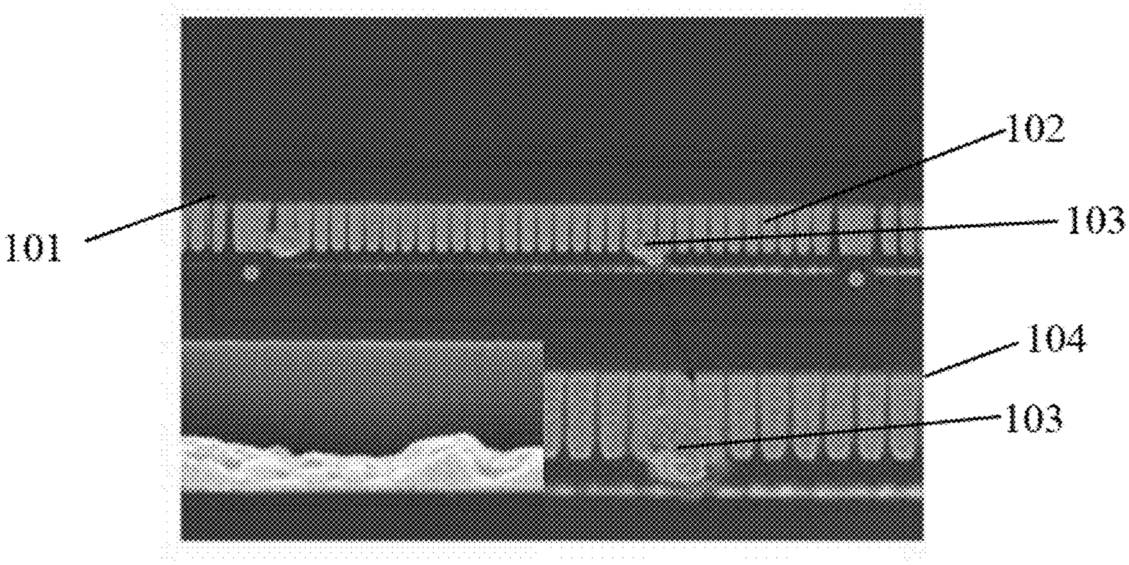
FIG. 1B (Prior Art)
FIG. 1B illustrates an SEM image of a cross section after transferring a sample to a nano prober in an existing nanoscale failure analysis method.
Figure 4C:
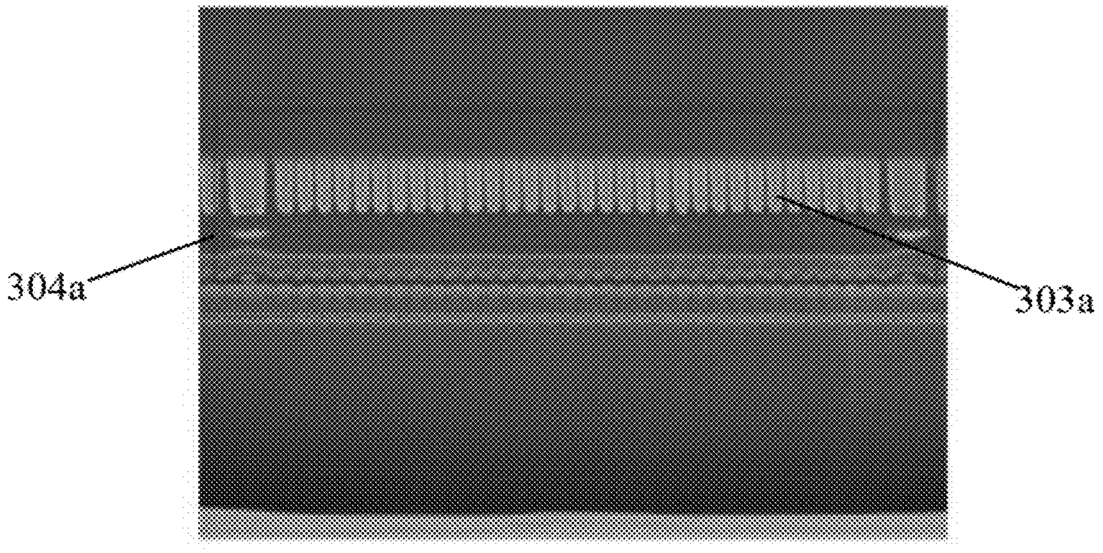
FIG. 4C illustrates an SEM image of a first cross section after removing a protective layer in step 4 of a nanoscale failure analysis method according to an embodiment of this application.

Referring to FIG. 4C, it illustrates an SEM image of a first cross section after removing a protective layer in step 4 of a nanoscale failure analysis method according to an embodiment of this application. Compared with FIG. 4B, the protective layer covering the surface of the metal pattern 303*a* is removed, so that electrical testing can be performed subsequently. At the same time, it can be seen that the structure of each metal pattern 303*a* is clear, no metal diffusion occurs, and the defect 103 formed by metal diffusion in FIG. 1B does not exist.

In step 5, probing is performed on the metal pattern 303 and electrical testing is implemented through the nano prober.

In this embodiment of this application, step 1 to step 5 form a group of cyclic steps, and in the nanoscale failure analysis method, a plurality of groups of cyclic steps are performed until a fail position is found in the first sample 301.

In this embodiment of this application, in step 1 of each group of cyclic steps, the target area is gradually reduced.

The target area is gradually reduced by adopting a bisection method.

Referring to FIG. 6A, the width of the top side of the first cross section 302 formed in each group of cyclic steps is the same and aligned along the length direction of the bit line. In FIG. 6A, each trench 501 is a trench formed in step 1 of each group of cyclic steps. All trenches 501 are aligned and are equal in size.

The width of the target area in each group of cyclic steps is less than or equal to the width of the top side of the first cross section 302.

Referring to FIG. 6A, the length direction of the target area in each group of cyclic steps is along the length direction of the bit line, and the length of the target area in each group of cyclic steps is gradually decreased. The target area in the first group of cyclic steps is an initial target area, and the length of the initial target area is several hundred micrometers. FIG. 6A illustrates that the length of the initial target area is about 280 μm.

Figure 6B:
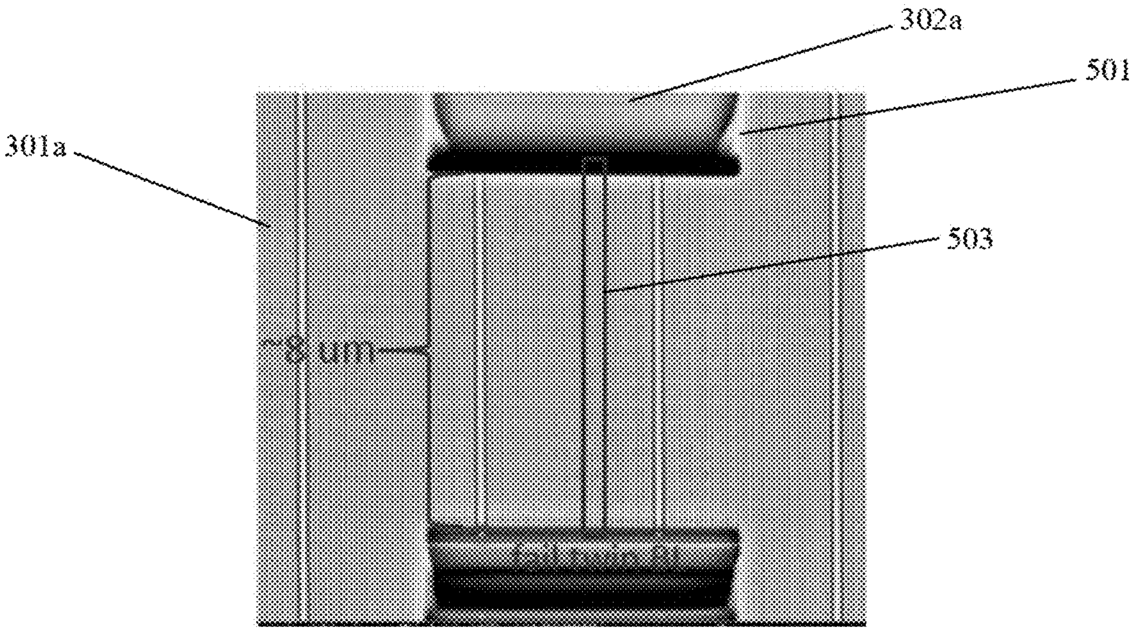
FIG. 6B illustrates an enlarged view of an area 502 in FIG. 6A.

The target area in the last group of cyclic steps is a final target area, the length and width of the final target area are within the range of TEM observation, and the fail position is located in the final target area. The length of the final target area is several micrometers. In FIG. 6A, the final target area is located in an area represented by box 502 FIG. 6B is an enlarged view of the area represented by box 502 in FIG. 6A. From FIG. 6B, it can be seen that the length of the final target area is about 8 μm. Therefore, through this embodiment of this application, the length of the target area can be reduced from about 280 μm to 8 μm.

After the last group of cyclic steps are completed, the nanoscale failure analysis method further includes performing TEM plane observation and TEM cross section observation on the final target area to determine a defect structure of the fail position. Due to the common knowledge of those skilled in the art, it is necessary to prepare a TEM sample before performing TEM observation, that is, to polish the first sample according to the size of the final target area to obtain the TEM sample, and then perform TEM observation. Through TEM observation, a clear structure of the defect at the fail position can be obtained. On the plane of the TEM sample, the TEM plane observation can obtain a TEM plane view result, and Energy Dispersive Spectroscopy (EDS) and line scan analysis can also be performed to obtain EDS and line scan analysis structures. On the cross section of the TEM sample, a TEM cross section structure can be obtained, and Electron Energy Loss Spectroscopy (EELS) analysis can also be performed to obtain an EELS analysis result.

In this embodiment of this application, the first sample 301 is not directly transferred to the nano prober after the first sample 301 is cut by adopting the ion beam in the FIB machine and the first cross section 302 is formed, but a protective layer is deposited on the first cross section 302 by adopting the electron beam in the FIB machine. Under the protection of the protective layer, metal diffusion can be prevented in the process of transferring the first sample 301 to the nano prober. After transferring to the nano prober, the protective layer is removed by adopting an ion source by using the characteristic that the nano prober is provided with the ion source. Then, electrical testing is performed. Since no metal diffusion occurs, the fail position can be analyzed through electrical testing. Therefore, this embodiment of this application can perform cross-section-probing testing on the sample by adopting the nano prober, can also prevent the diffusion of the metal exposed on the cross section in the process of transferring the sample to the nano prober, can implement fail position analysis through the electrical testing by the nano prober, and can continuously reduce the range of the target area containing the fail position, thus quickly finding the fail position, reducing the failure analysis time and workload, reducing the difficulty in finding the fail position and fail structure, and improving the accuracy of failure analysis.

This application has been described above in detail through the specific embodiments, which, however, do not constitute limitations to this application. Without departing from the principle of this application, those skilled in the art may also make many modifications and improvements, which should also be considered as included in the scope of protection of this application.

What is claimed is:

1. A nanoscale failure analysis method, comprising:

step 1: providing a first sample to be analyzed, placing the first sample on a sample stage of a focused ion beam (FIB) machine, wherein the FIB machine is a dual-beam system with an ion beam and an electron beam, and performing cutting on a selected area of the first sample by using the ion beam in the FIB machine to form a first cross section and expose a metal pattern on the first cross section;

step 2: depositing a protective layer on the first cross section by using the electron beam of the FIB machine;

step 3: transferring the first sample to a nano prober, the protective layer being used for protecting the metal pattern and preventing metal diffusion in a transfer process, wherein the nano prober is a nano probe system that integrates a scanning electron microscope;

step 4: performing surface micro treatment on the first sample by using another ion source in the nano prober to remove the protective layer and expose the metal pattern; and step 5: performing probing on the metal pattern and implementing electrical testing through the nano prober.

2. The nanoscale failure analysis method according to claim 1, wherein in step 1, after the first sample is placed on the sample stage, the sample stage is placed at a height of a common focal point of the ion beam and the electron beam.

3. The nanoscale failure analysis method according to claim 2, wherein in step 1, after the sample stage is placed at the height of the common focal point of the ion beam and the electron beam, and before the cutting is performed, the nanoscale failure analysis method further comprises setting an angle of the sample stage to a first angle, the first angle being between −38° and 52°.

4. The nanoscale failure analysis method according to claim 3, wherein in step 2, before the protective layer is deposited, the nanoscale failure analysis method further comprises setting the angle of the sample stage to a second angle.

5. The nanoscale failure analysis method according to claim 4, wherein the second angle is an angle obtained by anticlockwise rotating for 38° based on the first angle, so that a direction of the electron beam is perpendicular to the first cross section.

6. The nanoscale failure analysis method according to claim 1, wherein in step 2, a material of the protective layer comprises silicon dioxide.

7. The nanoscale failure analysis method according to claim 6, wherein in step 2, a thickness of the protective layer is 0.03 μm-0.07 μm.

8. The nanoscale failure analysis method according to claim 7, wherein in step 3, after the first sample is transferred to the nano prober, the nanoscale failure analysis method further comprises performing metal diffusion testing to verify that the metal diffusion has not occurred; and in a case that the metal diffusion testing finds that the metal diffusion has occurred, increasing the thickness of the protective layer in step 2 at a next time.

9. The nanoscale failure analysis method according to claim 1, wherein step 1 to step 5 form a group of cyclic steps, and in the nanoscale failure analysis method, a plurality of groups of cyclic steps are performed until a fail position is found in the first sample.

10. The nanoscale failure analysis method according to claim 9, wherein in step 1, the selected area of the first sample is set according to a target area, and the target area is a smallest analysis area containing the fail position confirmed before step 1; the first cross section is greater than or equal to a projection area of the target area on the first cross section, so that the metal pattern in the target area is all exposed on the first cross section; in step 2, a coverage area of the protective layer is greater than or equal to the projection area of the target area on the first cross section; and in step 1 of each group of cyclic steps, the target area is gradually reduced.

11. The nanoscale failure analysis method according to claim 10, wherein the target area is gradually reduced by adopting a bisection method.

12. The nanoscale failure analysis method according to claim 1, wherein in step 4, the ion source is Ar plasmas, and the surface micro treatment is implemented by bombarding the first sample with the Ar plasmas.

13. The nanoscale failure analysis method according to claim 12, wherein in step 4, a morphology of the metal pattern on the first cross section is observed at 0.5 kV to determine a stopping time of the surface micro treatment, and a time of the surface micro treatment is 10-20 min.

14. The nanoscale failure analysis method according to claim 10, wherein in step 1, the first sample is obtained through polishing, and the first sample is polished to a metal layer where the metal pattern is located.

15. The nanoscale failure analysis method according to claim 14, wherein the metal pattern comprises a bit line, and a length of the first sample along a length direction of the bit line is greater than or equal to a length of the bit line; a width of the first sample along a width direction of the bit line is greater than a width of a plurality of bit lines, the plurality of bit lines at least comprise fail twin bit lines and reference twin bit lines, the fail twin bit lines are short-circuited, and the reference twin bit lines are not conducted;

in step 1, a top side of the first cross section is along the width direction of the bit line;

a width of the top side of the first cross section formed in each group of cyclic steps is the same and aligned along the length direction of the bit line;

a width of the target area in each group of cyclic steps is less than or equal to the width of the top side of the first cross section; and a length direction of the target area in each group of cyclic steps is along the length direction of the bit line, and a length of the target area in each group of cyclic steps is gradually decreased.

16. The nanoscale failure analysis method according to claim 15, wherein the target area in a last group of cyclic steps is a final target area, a length and a width of the final target area are within a range of TEM observation, and the fail position is located in the final target area; and after the last group of cyclic steps are completed, the nanoscale failure analysis method further comprises performing TEM plane observation and TEM cross section observation on the final target area to determine a defect structure of the fail position.

17. The nanoscale failure analysis method according to claim 16, wherein the target area in a first group of cyclic steps is an initial target area, and a length of the initial target area is several hundred micrometers; and the length of the final target area is several micrometers.

* * * * *